United States Patent [19]

Niu et al.

[11] Patent Number: 5,144,580
[45] Date of Patent: Sep. 1, 1992

[54] QUANTUM WIRE CCD CHARGE PUMP

[75] Inventors: Qian Niu, Goleta; Klaus Ensslin, Santa Barbara, both of Calif.

[73] Assignee: Regents of the University of California, Oakland, Calif.

[21] Appl. No.: 570,904

[22] Filed: Aug. 21, 1990

[51] Int. Cl.⁵ ............................................. H01L 29/796
[52] U.S. Cl. .................................. 365/149; 324/678; 377/63; 357/4; 357/16; 357/22; 357/24
[58] Field of Search ................ 357/4, 22 A, 16, 24 R, 357/24 M; 324/678; 365/149; 377/63

[56] References Cited

U.S. PATENT DOCUMENTS 4,683,484  7/1987  Derkits, Jr. ........................ 357/24 M
4,969,018  11/1990  Reed ................................... 357/4

FOREIGN PATENT DOCUMENTS 212295  3/1987  European Pat. Off. .......... 357/4 SL

OTHER PUBLICATIONS

Hyneck, IEEE Trans on Electron Devices, May 1981, pp. 483-489.

*Primary Examiner*—William D. Larkins
*Attorney, Agent, or Firm*—Daniel L. Dawes

[57]  ABSTRACT

The very accurate quantization of charge transport or electron current is achieved within a heterostructure substrate by defining a quantum wire within the substrate and propagating a a.c. potential characterized by a travelling wave envelope along the length of the quantum wire. The travelling wave a.c. potential is applied to the length of the quantum wire by two opposing lateral gate arrays defined within the substrate. For each gate on the array is provided a corresponding gate on the opposing array which is offset in the direction of the current transport by a predetermined distance. A succeeding space is then provided in both arrays where there is no gate. An offset a.c. potential is then applied to the gate of one array, the offset gate of the opposing array and to the array as a whole through an overlying gate running the longitudinal length of the quantum, wire which gate applies a spatially independent a.c. potential along the length of the quantum wire.

21 Claims, 4 Drawing Sheets

QUANTUM WIRE CCD CHARGE PUMP

The invention was developed in part with funds received from the National Science Foundation contract DMR 87-03434 and 88-03335; the Office of Naval Research contract N00014-89-J-1530; and the United States Air Force contract AFS-88-0334.

BACKGROUND OF THE INVENTION

1. Field of the Invention

The invention relates to semiconductor devices exhibiting quantum mechanical performance characteristics, and in particular it relates to such semiconductor devices used as current sources.

2. Description of the Prior Art

Conventional semiconductor circuitry, even ultra miniaturized circuits, usually operate in a mode that can be described by classical or nonquantum mechanical, electrical theories of solids. However, in some cases the operation of the device cannot be explained by such classical theories, but only through a quantum mechanical theory. One such device is a Josephson Junction which operates to produce a quantized voltage in terms of $e/h$, where $e$ is the charge of an electron and $h$ Planck's constant. Additionally quantum behavior in quantum Hall effect devices is also observed and can be utilized to provide a quantized resistance which is a multiple of $h/e^2$.

Quantized adiabatic particle transport has been predicted and described by D. J. Thouless in Physical Review B 27,6083 (1983). According to Thouless an integral number of electrons is transported through any cross section as long as the Fermi gap in the conducting material is open at all times. Thouless has theoretically demonstrated that if the potential in a semiconductor is changed slowly in such a way that it returns to its starting value, the current across a boundary will be quantized for filled bands in an infinitely periodic system, but not in a finite torus. Thouless, however, did not propose any particular device in which quantization of current could be utilized or applied for any practical purpose.

Therefore, what is needed is an apparatus and method for providing quantized current as predicted by theory which would allow control of the quantized current to be known and made usefully available.

BRIEF SUMMARY OF THE INVENTION

The invention is an apparatus, hereafter called a quantum charge pump, for transporting a selected number of electron charges. The quantum charge pump comprises primarily a quantum wire, three sets of gates and a pair of source and drains.

The quantum wire serves as a channel for the charge flow. The source and drain are connected at the ends of the quantum wire, and they serve either as the storage places of the transported charges, or as the contacts to an external circuit. The three sets of gates are arranged along the top and the sides of the quantum wire. The charge flow is controlled by a moving potential wave along the quantum wire. The potential wave can be imposed by applying AC voltages on the lateral gates.

In one embodiment of the apparatus as described in detail below, the quantum wire lies on an interface of semiconductor hetrostructure whereon a two-dimensional electron gas usually resides. The quantum wire is a narrow conducting channel, in which only one or a few lateral modes are occupied by the electrons.

On one side of the quantum wire on the interface plane lies a first periodic array of gates with a predetermined spatial periodicity, $a$. Each gate substantially occupies one third of the unit distance, namely $a/3$. The essential function of the gates is to modify the effective thickness or the electronic potential of the quantum wire in the vicinity of the gates by applying voltages to the gates. A spatially periodic modulation of the quantum wire can be generated by applying a common voltage on this set of gates. In practice, the first array of gates of the wire are to be conductively connected together, so that they always have the same voltage.

A second periodic array of gates lies on the opposing side of the quantum wire. This second set of gates is identical to the first set, but its position along the quantum wire is offset from the first set by one third of the unit distance $a$. A common voltage on the second set of gates will produce a spatially periodic modulation of the quantum wire at positions offset from those of the first set by $a/3$.

The quantum wire is thus partitioned into succeeding segments as $l_1, l_2, l_3, l_1, l_2, l_3, \ldots$ each of length $a/3$. Here, $l_1$ is a segment in the vicinity of a gate of the first set, $l_2$ is in the vicinity of a gate of the second set, and $l_3$ is a region without a gate of either of the sets.

The quantum wire in the $l_3$ regions may be modulated by a top gate on the top of the quantum wire. The top gate extends uniformly along the quantum wire. The top gate voltage $V_3$ is to be applied with respect to the source which connects one end of the quantum wire. The voltages $V_1$ and $V_2$ on the first and second sets of lateral gates are to be applied with respect to the top gate.

The time dependencies of $V_1$, $V_2$ and $V_3$ are chosen such that a potential wave of the following form is imposed along the quantum wire:

$$U(x,t) = \sum_{j=1}^{3} A_j(t) u(x - ja/3)$$

where $u(x)$ is a local potential centered at $x=0$ and having an effective range of $a/3$. The amplitudes $A_j(t)$ are phase-shifted sinusoidal waves, i.e., $$A_j(t) = C + C_1 \cos[2\pi(j/3 - t/T)]$$

where $j = 1, 2, 3$, and $C$ and $C_1$ are predetermined constants.

The potential $U(x,t)$ simulates a periodic array of moving potential wells. The Fermi energy can be controlled by timing the value of $C$ on the top gate, such that n levels of each potential well is occupied, where n is a predetermined integer. The substrate is cooled to a predetermined temperature to limit high energy electron states the occupation. In a cycle, two 2n electrons (with spins up and down) get transported from one end of the quantum wire to the other. As a result, a selected number of electrons may be pumped from the source to the drain by controlling the voltages on the lateral gates and the top gate. When Coulomb effect is taken into account, a level is split into two with a Coulomb gap between them. If the Fermi energy is placed in a Coulomb gap, an odd number of electrons may be pumped.

The quantum wire and the lateral gates can be constructed by tailoring a two-dimensional electron gas in the interface of a semiconductor heterostructure, using focused ion beam technology.

The quantum charge pump, as invented, can precisely control the number of electrons pumped in a cycle; the possible error can be made exponentially small as the temperature and driving frequency get smaller than the energy gap at the Fermi energy. The device is also robust against small imperfections in the structure, in the sense that small amount of disorder does not influence the precise nature of the device at all. The temperature and frequency for precision operation can be greatly increased by raising the energy gap in the quantum wire through minimization of the feature sizes of the device.

The invention comprises the following major applications:

1) Memory Device

The quantum charge pump is coupled to a capacitor which provides and receives the pumped charges. Information is to be stored on the capacitor in terms of the number of charges that the capacitor carries. A selected number of electron charges can be deposited on or retrieved from the capacitor, corresponding to writing or reading the information, respectively. A separate circuit checks whether the capacitor has cleared out of charges.

2) Capacitive Standard

A selected number of charges is pumped onto a capacitor. The capacitance can then be determined by a precise measurement of the voltages on the capacitor.

3) A Precise DC Current Source

A selected strength of DC current can be produced by tuning the frequency (number of cycles per second) at which the pump is driven. Such a current source can also be used as a current standard.

More formally, the invention is an apparatus for transporting a selected number of electron charges. The apparatus comprises a quantum wire for providing a channel for flow of the electrons, and an element for applying a moving a.c. potential wave along the quantum wire so that a predetermined number of electrons are disposed within each well of the moving a.c. potential.

As a result, the number of electrons flowing through the quantum wire is selectively determined and controlled.

The element comprises a first and second plurality of opposing conductive gates defined along the sides of the quantum wire. Each gate of the first plurality of gates corresponds to a gate of the second plurality of gates and vice versa. Each gate of the first plurality of gates is spatially offset along the quantum wire from the corresponding one of the gates of the second plurality of gates. A control element applies a separate a.c. potential to the first and second plurality of gates. The a.c. potential applied to the first plurality of gates is phase shifted from the a.c. potential applied to the second plurality of gates.

The pairs of corresponding gates of the first and second plurality of gates are spaced apart from a succeeding pair of corresponding gates from the first and second plurality of gates by a gap along the quantum wire.

The corresponding gates of each pair of gates of the first and second plurality of gates and the corresponding gap succeeding the pair of gates along the quantum wire is equally spatially set off one from the other so that the pair of gates and gap extend a predetermined unit of distance along the quantum wire. Each gate substantially occupies one third of the predetermined unit distance.

The control means applies an a.c. potential to each gate of the pair of corresponding gates of the first and second plurality of gates and to the gap. The potential is phase shifted by one third cycle between each opposing gate and gap in an order corresponding to the spatial order of the gates and gap along the quantum wire.

The element for applying a moving a.c. potential applies an a.c. potential of the form $$U(x,t) = \sum_{j=1}^{3} A_j(t) u(x - ja/3)$$

where $U(x,t)$ is a local a.c. potential having an effective nonzero value across an interval $a/3$ and where $$A_j(t) = C + C_1 \cos[2\pi(j/3 - t/T)]$$

where $j$ is an integer and $T$ is the time periodicity of the amplitude $A_j(t)$.

The quantum wire and the lateral gates are defined on the interface of a semiconductor heterostructure. The heterostructure comprises an aluminum gallium arsenide layer and a gallium arsenide layer. The quantum wire is cooled to a predetermined temperature to ensure that in the quantum wire those states below the Fermi energy are almost fully occupied, and those above it are almost totally empty.

The element for applying the moving a.c. potential generates a moving a.c. potential comprised of a plurality of localized a.c. potentials simulating localized square wave a.c. potentials.

The control element further comprises a top gate for applying a spatially independent a.c. potential along the quantum wire.

The apparatus further comprises a capacitor. The capacitor is coupled to the quantum charge pump and receives and provides electron current to and from the pump respectively as controlled by the element for applying the moving a.c. potential.

The apparatus is used in further combination with a memory circuit wherein a plurality of distinguishable charge states is stored on the capacitor by control of the element of applying a moving a.c. potential transporting to the capacitor a predetermined number of electron charges corresponding to a selected one of the predetermined plurality of charge states on the capacitor.

The element for applying a moving a.c. potential applies a predetermined number of the moving a.c. potentials along a predetermined length of the substrate to transport a corresponding predetermined number of electric charges across a substrate so that the apparatus serves as a precise direct current standard.

The apparatus is used in further combination with a capacitor so that the apparatus is adaptable as a precise measuring standard of capacitance.

In summary and alternatively the invention is an apparatus for selectively transporting a predetermined number of electronic charges. The invention comprises a quantum wire for providing a defined direction of current flow of the electrons. A plurality of gates define a quantum wire. The gates are arranged in periodic arrays along the sides of the quantum wire. An element applies a plurality of periodically varying a.c. potentials to the plurality of gates to form a travelling wave envelope along the quantum wire.

As a result, a selectively controlled number of electrons is transported along the quantum wire.

The invention is also a method for transporting a selected discrete number of electron charges from a first to a second terminal. The method comprises the steps of defining a gated quantum wire within a heterostructure interface to provide channeled flow of the electrons through the quantum wire. The quantum change pump is coupled between the first and second terminals of an external circuit. An a.c. potential is imposed on the quantum wire characterized by a travelling wave envelope moving in the direction of the quantum wire to transport electrons from the first terminal to the second terminal.

As a result, a discrete number of electrons may be transported between the first and second terminals.

The invention can be better visualized by now turning to the following drawings wherein like elements are referenced by like numerals.

Figure 1:
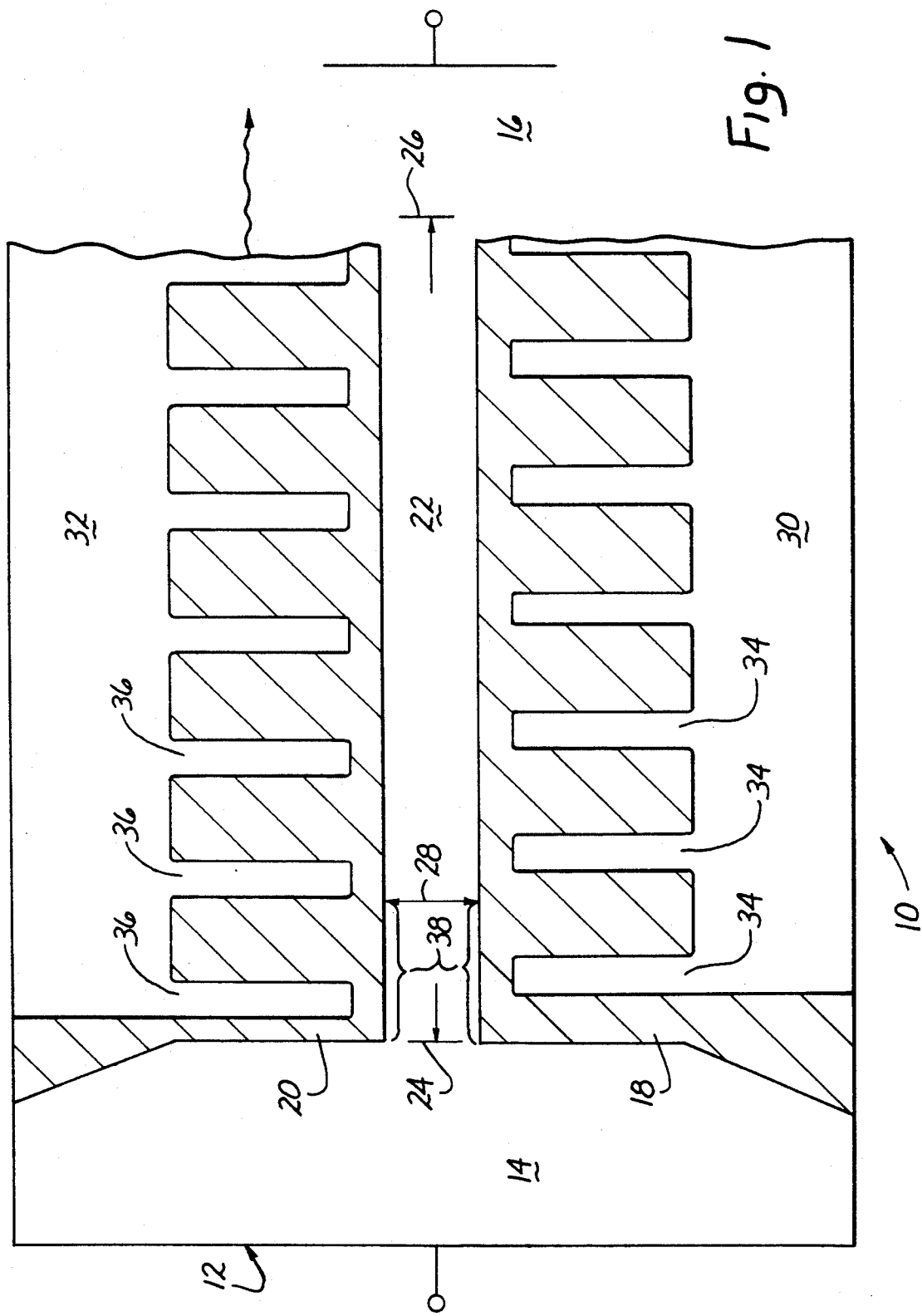
FIG. 1 is an idealized plan view of a gated quantum wire included within the charge pump of the invention shown with the top gate removed.

The invention and its various embodiments may now be understood by turning to the following detailed description.

DETAILED DESCRIPTION OF THE PREFERRED EMBODIMENT

The very accurate quantization of charge transport or electron current is achieved within a heterostructure interface by defining a quantum wire within the interface and propagating an a.c. potential characterized by a travelling wave envelope along the length of the quantum wire. The travelling wave a.c. potential is applied to the length of the quantum wire by two opposing lateral gate arrays and a uniform top gate defined along the sides and top of the quantum wire. For each gate on one lateral array is provided a corresponding gate on the opposing array which is offset in the direction of the current transport by a predetermined distance. A succeeding space is then provided in both arrays where there is no gate. An offset a.c. potential is then applied to the gate of one array, the offset gate of the opposing array and to the array as a whole through an overlying gate running the longitudinal length of the quantum wire, which gate applies a spatially independent a.c. potential along the length of the quantum wire.

The invention is an apparatus for transporting a selected number of electron charges comprising a quantum wire for providing a channel for flow of the electrons. A circuit element applies a moving potential along the flow of electrons in the quantum wire so that a predetermined number of electrons are disposed within each cycle of the moving potential along the quantum wire.

As a result, the number of electrons flowing through the quantum wire is selectively determined and controlled. The circuit element defines a gated quantum wire within the interface.

The circuit element comprises a first and second plurality of opposing conductive gates which, together with the quantum wire, define a gated quantum wire within the interface. Each gate of the first plurality of gates corresponds to a gate of the second plurality of gates and vice versa. Each gate of the first plurality of gates is spatially offset along the direction of current flow within the quantum wire from the corresponding one of the gates of the second plurality of gates. A control circuit applies a separate a.c. potential to the first and second plurality of gates. The a.c. potential applied to the first plurality of gates is phase shifted from the a.c. potential applied to the second plurality of gates.

The pairs of corresponding gates of the first and second plurality of gates are spaced apart from a succeeding pair of corresponding gates from the first and second plurality of gates by a gap or no-gate space extending along the distance of the current flow within the quantum wire.

The corresponding gates of each pair of gates of the first and second plurality of gates and the corresponding gap succeeding the pair of gates along the direction of current flow within the quantum wire is equally spatially set off one from the other so that the pair of gates and gap extend a predetermined unit of distance along the direction of the current flow within the quantum wire. Each of the gate substantially occupies one third of the predetermined unit distance.

The control circuit applies an a.c. potential to each gate of the pair of corresponding gates of the first and second plurality of gates and to the gap with a phase differential of one third cycle offset each gate and gap from the other in an order corresponding to the spatial order of the gates and gap along the direction of current flow within the quantum wire.

The corresponding gates of each pair of gates of the first and second plurality of gates in the corresponding gap succeeding the pair of gates along the direction of current flow within the quantum wire is equally divided so that the pair of gates and gap extend a predetermined unit of distance along the direction of the current flow within the quantum wire. and wherein each the gate substantially occupies one third of the predetermined unit distance.

The circuit element for applying a moving a.c. potential applies a a.c. potential of the form:

$$U(x,t) = \sum_{j=1}^{n} A_j(t)u(x - ja/n)$$

where $U(x, t)$ is a local a.c. potential having an effective nonzero value across an interval $a/n$ and where $$A_j(t) = C + C_1\cos[2\pi(j/n - t/T)]$$

where j is an integer and T is the time periodicity of the amplitude $A_j(t)$ and where n is an integer.

The smallest number of the local a.c. potentials combinable to form the moving a.c. potential along the current direction of the quantum wire is n=3.

The quantum wire a channel of defines electron flow within a two-dimensional interface between a first and second semiconducting layer. In the illustrated embodiment the heterostructure comprises an aluminum gallium arsenide layer and a gallium arsenide layer.

The quantum wire is cooled to a predetermined temperature to prevent higher energy state within the quantum wire being occupied.

The circuit element for applying the moving a.c. potential generates a moving a.c. potential comprised of a plurality of moving localized a.c. potentials simulating localized square wave a.c. potentials.

The circuit element further comprises a top gate for applying a spatially independent a.c. potential along the direction of the current flow within the quantum wire.

The apparatus further comprises a capacitor. The capacitor is coupled to the quantum wire for receiving and providing electron current to and from the quantum wire respectively as controlled by the circuit element for applying the moving a.c. potential.

The invention is the apparatus described above in further combination with a memory circuit wherein a plurality of distinguishable charge states is stored on the capacitor by control of the circuit element of applying a moving a.c. potential transporting to the capacitor a predetermined number of electron charges corresponding to a selected one of the predetermined plurality of charge states on the capacitor.

The circuit element for applying a moving a.c. potential applies a predetermined number of the moving a.c. potentials along a predetermined length of the quantum wire to transport a corresponding predetermined number of electric charges across a quantum wire so that the apparatus serves as a precise direct current standard.

The apparatus is provided in further combination with a capacitor so that the apparatus is adaptable as a precise measuring standard of capacitance.

The invention is also characterized as an apparatus for selectively transporting a predetermined number of electronic charges comprising a quantum wire for providing a defined direction of current flow of the electrons. A plurality of gates, together with a quantum wire, define a gated quantum wire. The gates are arranged in a periodic array along the sides of the quantum wire. A circuit element applies a plurality of periodically varying a.c. potentials to the plurality of gates to form a travelling wave envelope along the quantum wire of the gated quantum wire.

As a result, a selectively controlled number of electrons is transported along the gated quantum wire.

The invention is a method for transporting a selected discrete number of electron charges from a first to a second terminal comprising the steps of defining a gated quantum wire within an interface to provide channeled flow of the electrons through the quantum wire. The quantum wire is coupled between the first and second terminals. An a.c. potential is imposed on the quantum wire, which a.c. potential is characterized by a travelling wave envelope moving in the direction of the quantum wire to transport electrons from the first terminal to the second terminal.

As a result, a discrete number of electrons may be transported between the first and second terminals.

The invention now having been generally described without reference to the drawings, turn to the drawings for a better visualization of the invention. A quantum charge pump, generally denoted in the Figures by reference numeral 10, is devised to provide a selectively controlled current in multiples of electrons. A selectively controlled current as small as one electron is produced. Charge pump 10 in the illustrated embodiment is disposed in a gallium arsenide heterostructure substrate although silicon substrates or other semiconducting materials could be utilized with equal generality. Gallium arsenide is chosen in preference to silicon because the electrons within the interface of gallium arsenide heterostructure have a smaller effective mass and higher mobility than in a silicon structure. Charge pump 10 is formed of a heterostructure of aluminum gallium arsenide and gallium arsenide so that the quantum wire 22 is formed out of a two-dimensional electron gas situated at the interface of the gallium arsenide and aluminum gallium arsenide.

Again, in the illustrated embodiment charge pump 10 is operated at approximately 1–20 degrees K although it is expected that the charge pump of the invention will be able to operate at higher temperatures, possibly within the range of liquid nitrogen and higher.

An end electrode, denoted by reference numeral 14, is formed at one end with a similar opposing end electrode 16 formed at the opposite end of the quantum wire. Utilizing a focused gallium ion beam gun, such as model Nanofab 150UHV manufactured by Micro Beam Inc. of California, a focused beam of 150 ke V gallium ions is implanted near the heterostructure interface 12 to form lattice distortions and disruptions. The dislocations are selectively disposed into interface 12 to form a first insulating pattern 18 and corresponding opposing insulating pattern 20 as shown in the plan view of FIG. 1. Regions 18 and 20 become substantially nonconductive in the lateral direction of substrate 12, namely in the plane of the illustration of FIG. 1. See A. Wieck et. al., "In-Plane Gated Quantum Wire Transistor Fabricated with Directly Written Focused Ion Beams", Applied Physical Letters 56(10), 5 Mar. 1990.

The energy band structure in the vertical direction of the heterostructure maintains the electron gas within a two-dimensional flow of the plane of the illustration of FIG. 1.

Therefore, electrons are able to flow from contact 14 to 16 only through a longitudinal channel 22 which is also termed a quantum wire 22. A quantum wire is defined as a path length of electron flow wherein the quantum state of the conducting electrons is selectively controlled.

Nonconducting regions 18 and 20 are formed by the focused gallium beam in a periodic array offset relative to each other. The pattern is shown in highly idealized square form in FIG. 1 and in actuality will be much smoother due to the finite diameter of the beam, i.e. about 60–80 nm, impinging upon the hererostructure as well as practical limitations upon the fineness of its control.

In the illustrated embodiment, quantum wire 22 is formed with a length of approximately 1.5 microns from boundary 24 to 26. The geometrical width 28 of quantum wire 22 is of the order of 1 micron, but is not critical. The effective width of quantum wire 22 can always be effectively adjusted by application of appropriate voltage levels to side contacts 30 and 32.

Nonconductive regions 18 and 20 are formed so that conducting gates 34 and 36 of conductive regions 30 and 32, respectively, extend laterally into the nonconducting region 18 and 20 toward quantum wire 22 in a generally perpendicular direction to quantum wire 22. As shown in FIG. 1, gate 36 is the leftmost gate in the array of charge pump 10 as shown in FIG. 1, while gate 34 in the arrays is disposed in the next adjacent but opposing position one step to the right in FIG. 1. At a third step no gate extends into nonconductive regions 18 and 20. The three steps, two gates and one no-gate space, comprise a unit cell 38 of the device. The pattern as established with the first three longitudinal steps down the length of quantum wire 22 is then periodically repeated along its entire length.

Figure 3:
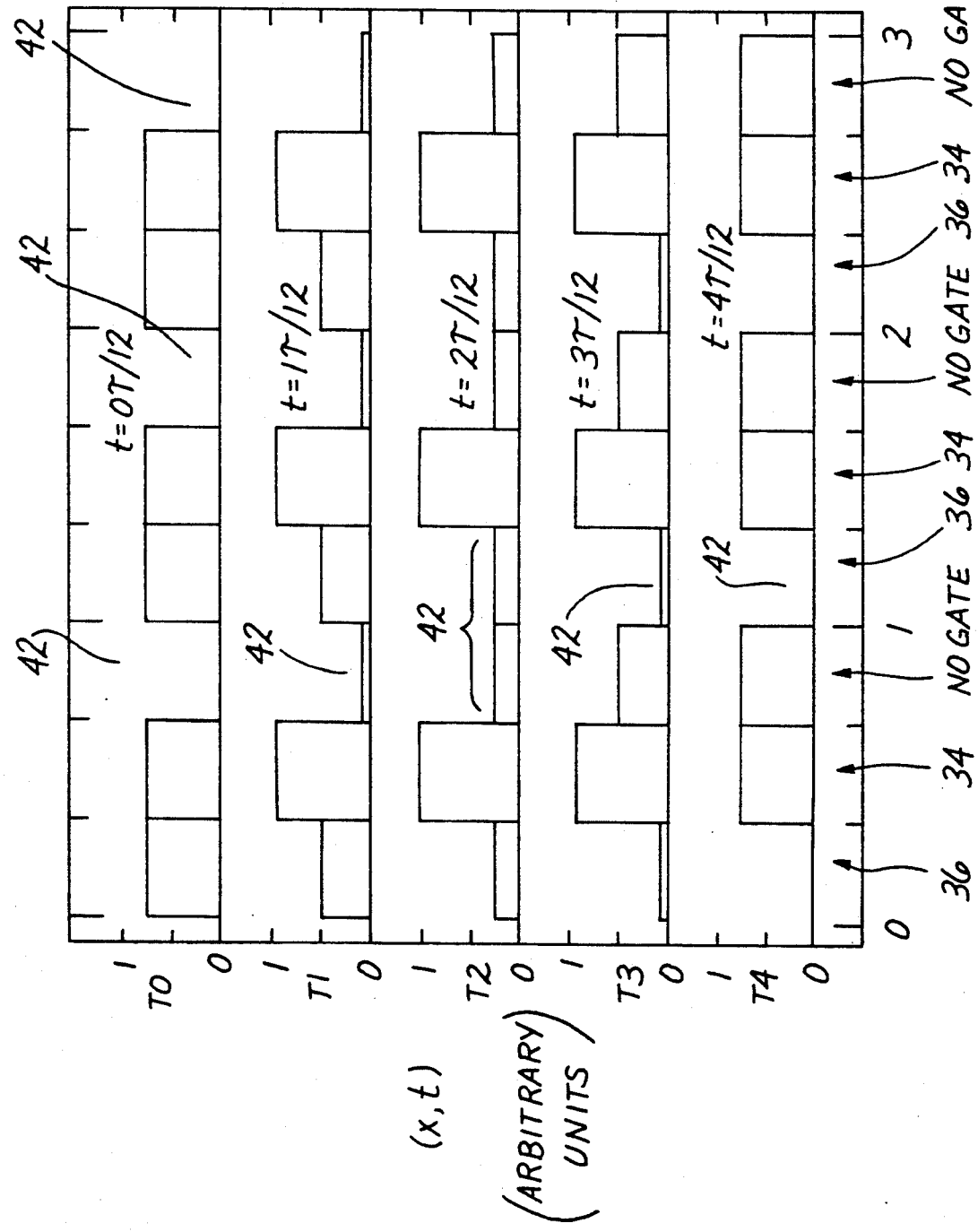
FIG. 3 is a diagrammatic graph of the moving a.c. potential shown over one third of a cycle.

The two-dimensional electron gas outside quantum wire 22 is used to influence the potential within quantum wire 22. Since the electron gas outside the quantum wire can be confined or controlled in a periodic manner along the wire, the influences along the wire will also be periodic. As shown in FIG. 1, there are two sets of lateral gates on either side of the quantum wire which are phase-shifted with respect to each other. In between each of the two gates on each side there is an area with no lateral gate with the result that as shown in FIG. 3 there are three alternating a.c. potentials along quantum wire 22, namely lateral gate 36, lateral gate 34 and then no gate.

The lateral gates 30 and 32 are formed by a focused ion beam of approximately 600 Angstroms in diameter. Tunneling through lateral gates 30 and 32 is very unlikely because of their thickness which is chosen for this reason. A previously developed lateral gating technique is used to change a.c. potential in a periodic manner along the length of quantum wire 22 as described by Wieck et. al., "In-Plane Gated Quantum Wire Transistor Fabricated with Directly Written Focused Ion Beams", Applied Physical Letters 56(10), Mar. 5, 1990. See also German Patent Application P 39 14 007.5 (1989).

The physical width 28 of quantum wire 22 is approximately 100-1,000 nanometers. However, in order to avoid multiple modes and therefore multiple numbers of electron states with within each cell 38 along the length of quantum wire 22, a.c. potentials of side contacts 30 and 32 are adjusted so that the effective electrical width available for electron states within quantum wire 22 is approximately 150 Angstroms.

Quantum charge pump 10 is operated to precisely pump a charge of Ne per operating cycle where e is the charge of a single electron and N is an integer, typically between 1 and 10. Charge pump 10 is bidirectional so that the charges may enter electrode 12 or 16 depending upon the direction of cycling or pumping which is utilized as described below. The pumping action is effectuated by applying voltages to side electrodes 30 and 32 and top gate 40 shown in perspective view of FIG. 2, which is a planar sheet overlying the entire periodic array of cells 38 shown in FIG. 1. The electron mechanics in the charge pump can be characterized in essence as a one-dimensional noninteracting electron gas in a sliding periodic a.c. potential, $U(X-at/T)$, where a is the spatial periodicity of the a.c. potential and the propagation speed is $a/T$.

If it can be assumed that the electrons are at zero temperature, they will initially occupy an integer number of Bloch bands within the gallium arsenide crystal. Assume, for example, that h/T is much smaller than the electron energy gap of the quantum wire at the Fermi energy so that initially all the filled bands remain filled. The electron density then shifts rigidly with the sliding a.c. potential. The number of electrons flowing across any point in time T is then equal to the number of electrons in a spatial period of the sliding a.c. potential. This number is an even integer, due to the spin degeneracy of the electron states.

In practice, the a.c. potential may consist of a series of histograms as diagrammatically depicted in FIG. 3. The histographic potential can be viewed as spatially stationery with its height oscillating in time at each gate so that the minima propagate down the quantum wire. For example, the top panel in FIG. 3 is the histographic a.c. potential at time T0. The next panel below is the histogram a.c. potential at T1 followed in succeeding panels with the a.c. potential at times T2 through T4 which are each separated by one twelfth of a period. The horizontal axis is the spatial coordinate down the longitudinal length of quantum wire 22.

The phases of the oscillating heights of the sliding a.c. potential are synchronized so that the envelope forms a travelling wave. The Fermi energy is fixed in the gap above the lowest Bloch band by application of an appropriate a.c. potential to the Fermi gate 40. The number of electrons transported across any point in time is then two. In other words, the electrons are locked at the minima of a a.c. potential wave and travel with it.

Figure 2:
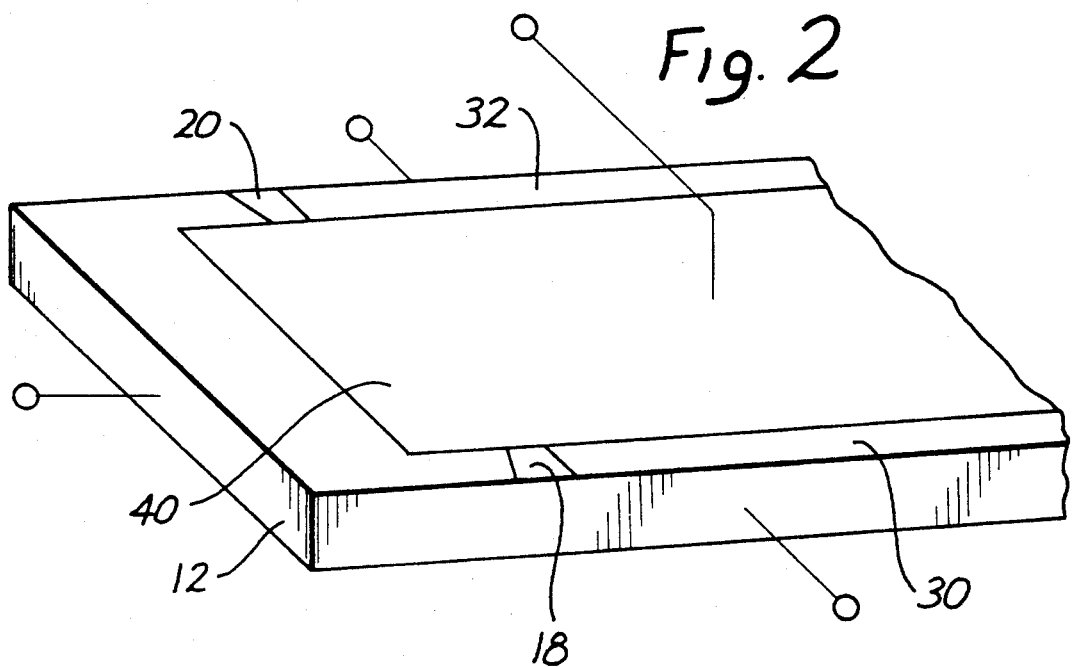
FIG. 2 is a idealized schematic view of the charge pump of FIG. 1 shown with the top gate in position.

As best depicted in perspective view in FIG. 2, on top of the entire quantum wire 22 is a metallic top gate which is vapor deposited and is used to change the overall a.c. potential of all the characters within wire 22. The a.c. potential applied to gate 40, the top gate, is the spatially independent term within the a.c. potential $C(t)$, reference and equations 1 and 2 below.

Figure 4:
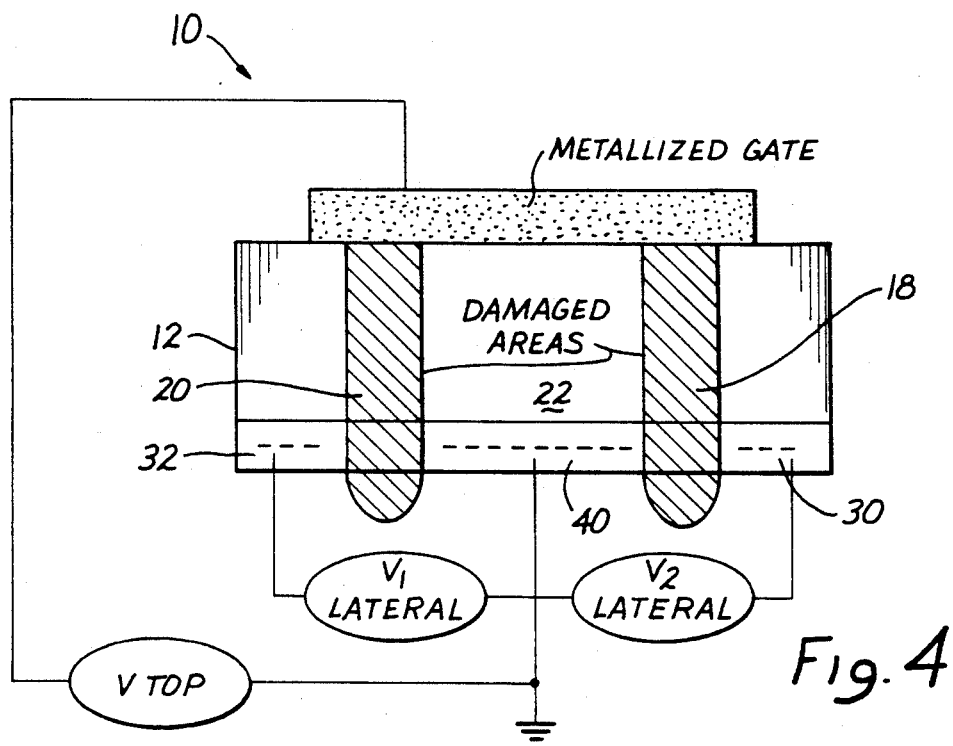
FIG. 4 is a diagrammatic side view taken through section 3—3 of FIG. 2.

FIG. 4 is a diagrammatic side view of device 10 as seen through section 4—4 of FIG. 1. The voltage on gate 40 (biased with respect to the source 14) is $A_3(t)$, the voltage on contact 32 (biased with respect to gate 40) and hence gate 36 is $A_1(t)-A_3(t)$ and the voltage on contact 30 (biased with respect to gate 40) and hence gate 34 is $A_2(t)-A_3(t)$. The voltages $A_1$, $A_2$ and $A_3$ are varied sinusoidally with 120 degrees shifted phase to produce the sliding a.c. potential of FIG. 3. The periodic travelling wave therefore realized within quantum wire 22 has impressed upon it by contacts 30 and 32 and the gates corresponding with them and gate 40. The frequency of the periodic wave is typically 1–10 GHz and is limited only by the frequency generator of an atomic clock.

In FIG. 3, three histographic blocks represent a single wave length. The minima are at the positions 42. The height of each a.c. potential $A_j(t)$ varies in time according to the equation:

$$A_j(t) = C(t) + C_1 \cos\left[2\pi(j/3a - t/T)_i\right] \qquad \text{Equation \#1}$$

so that the a.c. potential is:

$$U(x,t) = \sum_{j=1}^{3} A_j(t) u(x - ja/3) \qquad \text{Equation \#2}$$

where $u(x)=1$ for absolute value of x less than $a/6$ and otherwise $u(x)=0$, where T is the time cycle period of the wave envelope. The additionally spatially independent term, $C(t)$, is chosen so that the Fermi energy of the source 14 always lies in the energy gap. $C(t)$ can only be varied through the voltage on the top gate 40.

The local a.c. potentials in the illustrated embodiment, idealized in FIG. 3 as square waves, are equally offset in phase one from the other by a third of a cycle. Therefore, at three points during each cycle one of the a.c. potentials will decrease to zero while the adjacent a.c. potentials are equal, nonzero and form a well. Thus, the minimum number of a.c. potentials which are required to be used in combination to perform a well are three in a one-dimensional channel since the well and the two opposing side walls of the well must be formed if the electron is to be localized within the well. The same three offset a.c. potentials are then applied to the next cell along the quantum wire as diagrammatically depicted in FIG. 3. Every third localized a.c. potential is thus in phase and equal.

Every one third of the cycle of the localized a.c. potentials will thus cause a well 42 to move down the direction of current flow in the quantum wire by a distance equal to one third of the wave length of the frequency of the moving wave envelope. Movement by one third of the wave length is shown in FIG. 3 between the times T0 and T4. It is entirely within the scope of the invention that other fractions of a cycle could be used as desired to shape or create moving a.c. potential wells.

It must be understood that square wave a.c. potentials, as idealized in FIG. 3, are not necessarily applied to the quantum wire. Gates 34 and 36 are not precisely rectangular and thus the a.c. potentials which are impressed upon quantum wire 22 by them are also not exact square waves as depicted in FIG. 3. Instead, it is enough that the a.c. potential be generally localized within the area of the gate or gap so that a moving a.c. potential well 42, which may be of arbitrary shape, propagates down the length of the quantum wire. Propagation along the length of the quantum wire is assured by virtue of the periodicity of gates 34 and 36 and the two opposing arrays of gates integrally extending from contacts 30, 32.

Lateral gates 34 and 36 are formed with a periodicity of 150 nanometers with twenty periods resulting in an energy gap of about 1 meV. The temperature device 10 must there be kept at about 1 degree K. in order to prohibit higher line states from being propagated. When the a.c. potential is modulated with the frequency of 1 GHz, the direct current within quantum wire 22 is of the order of several nanoamps. The voltage frequency on the lateral gates and top gate of device 10 can be very accurately controlled by atomic clocks.

It is predicted on the basis of quantum mechanical theory of adiabatic particle transport that for a finite Fermi energy gap within quantum wire 22, the electron motion will be insensitive to many kinds of perturbations, such as thermal activation, non adiabatic excitation, static disorder, many-body interaction, finite size and the like. The correction due to thermal activation is of the order of $\exp(-Eg/(KT))$ which can be very small if the thermal energy gets smaller than the energy of the energy gap, Eg. The correction due to nonadiabatic excitations is an exponential of $\exp(-Eg/(h\nu))$ and therefore could be easily controlled. It has been theoretically shown by Niu and Thouless in the Journal of Physics, A17, page 2453 (1984) that quantization of the charge transport is not affected by disorder of the crystal and many-body interaction, as long as the adiabatic ground state of the system is separated from the excitations by finite energy gap.

Finally, although the contacts 14 and 16 at the end of device 10 will certainly close the Fermi gap in the device at those locations, the states in the gap are localized in the leads. In order for these states to have an effect, they must tunnel from one end of device 10 to the other. Correction to quantization is therefore of the order of $\exp(-L/l)$ where L is the length of the quantum wire 22 and l is the localization length of the edge states at contacts 14 and 16.

Once device 10 lies near an ideal configuration, every conceivable correction to the quantization is either identically zero or exponentially small when a perturbation analysis is made. Therefore, charge transport through the length of device 10 can be quantized as a practical matter to lead to an extremely accurate standard for electric charge and current measurements.

Figure 5:
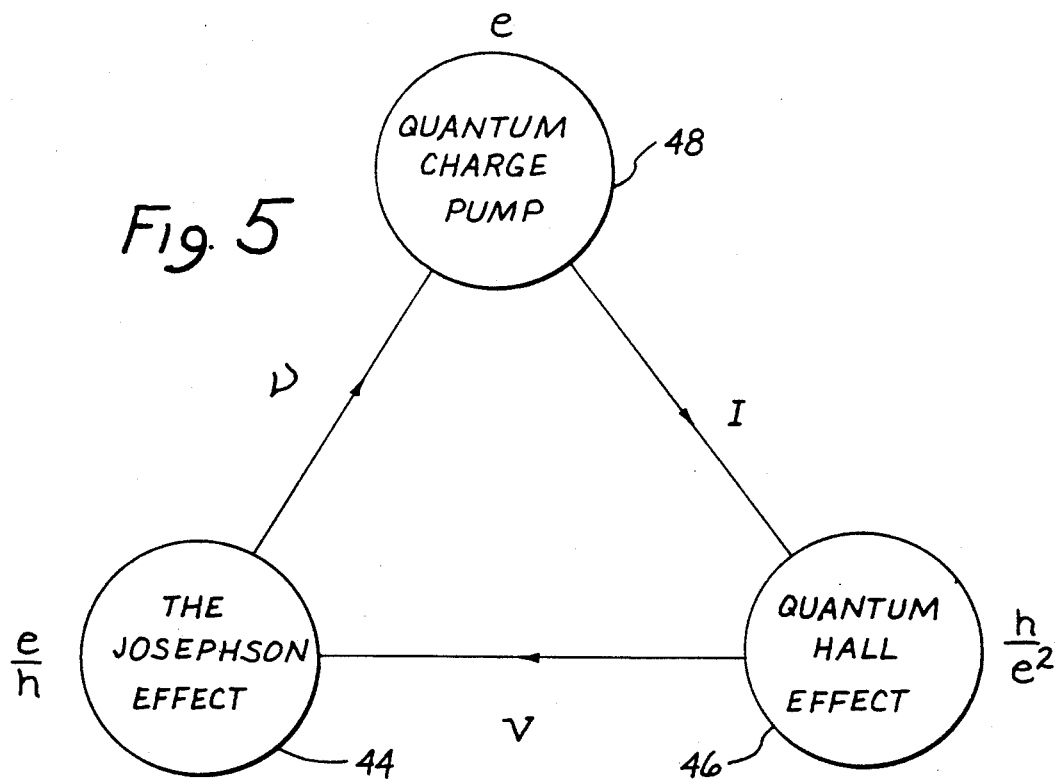
FIG. 5 is a diagram showing the conceptual relation of the quantum charge pump effect to other laws of nature.

FIG. 5 is a symbolic diagram which illustrates the relationship of the phenomena exploited by the methodology of the invention to other known observable quantum mechanical effects. For example, the Josephson effect, denoted by circle 44, is a phenomenon wherein the frequency of electrical excitation is quantized in units of e/h times the applied V. The quantum Hall effect, denoted by symbolic circle 46, similarly is a phenomenon wherein voltage is quantized in multiples of $h/e^2$ times current I. The quantum charge pump of the invention, symbolically denoted by circle 48, is the conceptual Ohms Law analog of the other two in that charge transport or current is quantized in multiples of e, the charge of a single electron. Therefore, it is within the intent and scope of the invention that a charge pump device such as shown in FIG. 1 can be controlled and its output coupled to a conventional capacitor which can then be controllably charged by a discrete number of electrons with precision equal to one electron charge. Such a controllably charged capacitor can then be used in measurements and measuring devices as a standard or reference with the highest degree of precision capable given the observed quantization of charge in nature. The amount of pumped charges is easily and accurately controlled by controlling the number of operating cycles or periodic wave transversals of quantum wire 22 executed within device 10.

In addition, device 10 can be used as a high resistance current source. The resistance is considered as exponentially large along the length of quantum wire 22 until the voltage becomes comparable to Eg/e.

Further applications of device 10 can be used in semiconductor memories. For example, a controlled number of electrons can be stored into a capacitor again by driving device 10 with a corresponding number of pulses or travelling wave transversals of the length of quantum wire 22. Insofar as the capabilities of the charge pump device 10 are concerned, it is possible to discriminate between states on the capacitor by an amount as small as a single electron charge. Device 10 may be used to charge up a capacitor as well as discharging a capacitor for read-out.

Figure 6:
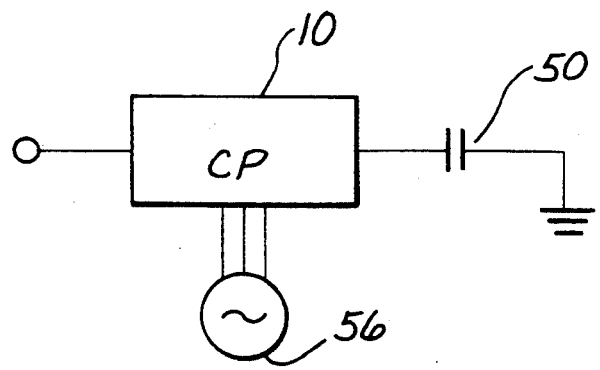
FIG. 6 is a block diagram illustrating charging a capacitor using the charge pump.

FIG. 6 illustrates a diagrammatic depiction of such a memory cell. Charge pump 10 is coupled to capacitor 50 and is directionally driven by an oscillator 52 coupled to electrodes 30, 32 and 40 in the manner described above. In a practical device, distinguishable charge states may vary by more than a single electron charge by partitioning the a.c. potential charge on capacitor 50 into a predetermined number of discrete levels. For example, it is entirely possible to build a decimal state memory in which ten very accurately controlled charge levels can be stored and read from capacitor 30 by charge pump 10. The ten distinguishable charge levels on capacitor 50 may be arbitrarily chosen in order to provide easy and practical charge discriminations by a sense amplifier which would be coupled to the memory cell of FIG. 6.

As a result, the information density storable on memory cells not limited to binary memory states is dramatically increased. For example, in order to store a megabyte of information in conventional binary memory, 8 million memory cells are required. A memory cell of FIG. 6 which was configured to pump any one of ten charge levels into capacitor 50, including the zero charge state, could hold five times as much information as a binary cell. The number of such decimal cells which would be required to hold an equivalent amount of information to that in one megabyte of binary memory cells would then be five times fewer. If the same memory cell of FIG. 6 were operated so as to generate a hundred distinguishable states within capacitor 50, including the zero charge state, a fifty-fold increase over a binary cell would be realized. The increase in information density by using the charge pump memory cell of FIG. 6 as compared to conventional binary memory cells is then limited only by the ability of the sense amplifier reading the memory cells to distinguish between charge states of capacitor 50 and the maximum charge carrying capacity of capacitor 50.

The speed and size of memory cells constructed according to FIG. 6 is easily comparable and is expected to be substantially several orders of magnitude better than that realizable by the best performing and highest density conventional binary memory cell now known.

Many alterations and modifications may be made by those having ordinary skill in the art without departing from the spirit and scope of the invention. Therefore, the invention has been described above only for the purposes of example and clarification. The specification should therefore not be read as limiting the invention which is defined by the following claims, which include all equivalent means as well as means for performing substantially similar functions for obtaining substantially similar results even though performed in a substantially different way.

We claim:

1. An electrical apparatus including a constant current source for supplying a constant current to an output element, said constant current source comprising:
    a semiconductor substrate having defined therein an elongated channel for conduction of charge carriers, said elongated channel being a quantum wire defined by barriers confining the charge carriers to the channel in directions normal to the direction of elongation, and being sufficiently thin as measured between the barriers that, at the temperature of operation of the device, one or more discrete energy levels for the charge carriers in said conductive channel resulting from quantum mechanical size effects are produced and charge carriers in said channel are confined to a group of one or more of the lowest lying such discrete energy levels, so that no more than two charge carriers may occupy each level of said group of lowest lying discrete energy levels;
    means for maintaining said substrate at a temperature such that charge carriers in said elongated channel are confined to said group of lowest lying discrete energy levels;
    an input terminal at one end of said elongated channel for suppling charge carriers to said channel;
    an output terminal at the other end of said elongated channel connected to said output element; and
    control conductive elements spaced along the length of said elongated channel, said control conductive elements being connected in two sets so that elements of any one of said two set are spaced from other elements of the same set by one element of said other set, a pair of neighboring elements from said two sets forming a cell, said two sets of elements each being connected to a corresponding periodically varying voltage, said periodic varying voltages applied to each set being out of phase with said corresponding periodically varying voltage of said other set so that charge carriers introduced into said channel at said input end are transferred sequentially along said channel under the influence of said periodically varying voltages to said output end, with the current supplied to said output end equalling one or two electronic charges for each level of said group per cell for each complete cycle of said periodically varying voltages.

2. The apparatus of claim 1 wherein said quantum wire having a physical width in the range of 100 to 1000 nanometers.

3. The apparatus of claim 1 wherein said control conductive elements comprise:
    a first and second plurality of opposing conductive gates defined within said substrate, each gate of said first plurality of gates corresponding to a gate of said second plurality of gates and vice versa, each gate of said first plurality of gates being spatially offset along said direction of current transport within said substrate from said corresponding one of said gates of said second plurality of gates, said opposing gates of said first and second plurality of gates together with said spatial offset comprising a cell of gates; and
    control means for applying a separate a.c. voltage to said first and second plurality of gates, said a.c. voltage applied to said first plurality of gates being phase shifted from said a.c. voltage applied to said second plurality of gates, said control gates providing an a.c. voltage in the range of 1 to 10 Gigahertz.

4. The apparatus of claim 3 wherein said pairs of corresponding gates of said first and second plurality of gates are spaced apart from a succeeding pair of corresponding gates from said first and second plurality of gates by a gap along the distance of said current transport within said substrate.

5. The apparatus of claim 4 wherein said corresponding gates of each pair of gates of said first and second plurality of gates and said corresponding gap succeeding said pair of gates along said direction of current transport within said substrate is equally spatially set off one from the other so that said pair of gates and gap extend a predetermined unit of distance along the direction of said current transport within said substrate, and wherein each said gate substantially occupies one third of said predetermined unit distance.

6. The apparatus of claim 4 wherein said control means applies an a.c. potential to each gate of said pair of corresponding gates of said first and second plurality of gates and to said gap with a phase differential of one third cycle offset each gate and gap from the other in an order corresponding to the spatial order of said gates and gap along said direction of current transport within said substrate.

7. The apparatus of claim 6 wherein said corresponding gates of each pair of gates of said first and second plurality of gates in said corresponding gap succeeding said pair of gates along said direction of current transport within said substrate is equally divided so that said pair of gates and gap extend a predetermined unit of distance along the direction of said current transport within said substrate, and wherein each said gate substantially occupies one third of said predetermined unit distance.

8. The apparatus of claim 1 wherein said means for applying a moving a.c. potential applies a a.c. potential of the form $$U(x,t) = \sum_{j=1}^{n} A_j(t)u(x - ja/n)$$

where U(x,t) is a local a.c. potential having an effective nonzero value across an interval a/n and where $$A_j(t) = C + C_1 \cos[2\pi(j/n - t/T)]$$

where j is an integer and T is the time periodicity of the amplitude $A_j(t)$ and where n is an integer.

9. The apparatus of claim 8 wherein the smallest number of said local a.c. potentials combinable to form said moving a.c. potential along said current direction of said substrate is n=3.

10. The apparatus of claim 1 wherein said substrate comprises a heterostructure of an aluminum gallium arsenide layer and a gallium arsenide layer.

11. The apparatus of claim 1 wherein said substrate is cooled to a predetermined temperature to limit higher energy state electron conduction within said substrate.

12. The apparatus of claim 1 wherein said means for applying said moving a.c. potential generates a moving a.c. potential comprised of a plurality of moving localized a.c. potentials simulating localized square wave a.c. potentials.

13. The apparatus of claim 3 wherein said control conductive elements further comprise a gate for applying for applying a spatially independent a.c. potential along the direction of said current transport within said substrate to set the Fermi energy gap in said substance, said gate being referenced hereinafter as a Fermi gate.

14. The apparatus of claim 1 further comprising a capacitor, said capacitor being coupled to said substrate for receiving and providing electron current to and from said substrate respectively as controlled by said means for applying said moving a.c. potential.

15. The apparatus of claim 14 in further combination with a memory circuit wherein a plurality of distinguishable charge states is stored on said capacitor by control of said means of applying a moving a.c. potential transporting to said capacitor a predetermined number of electron charges corresponding to a selected one of said predetermined plurality of charge states on said capacitor.

16. The apparatus of claim 1 in further combination with a capacitor so that said apparatus is adaptable as a precise measuring standard of capacitance.

17. The apparatus of claim 1 further comprising storage means coupled to said substrate for storing charges transported across said substrate into said storage means.

18. The apparatus of claim 1 wherein the operating temperature of said quantum wire is in the range of 1-20 degrees Kelvin.

19. The apparatus of claim 1 wherein the effective electrical width of said quantum wire is in the range of 100 to 1000 nanometers.

20. The apparatus of claim 3 wherein only one said cell of gates is included within said apparatus.

21. A method for supplying a constant current to an output element comprising the steps of:

defining an elongated channel for conduction of charge carriers in a semiconductor substrate, said elongated channel being a quantum wire defined by barriers confining the charge carriers to the channel in directions normal to the direction of elongation, and being sufficiently thin as measured between the barriers that, at the temperature of operation of the device, one or more discrete energy levels for the charge carriers in said conductive channel resulting from quantum mechanical size effects are produced and charge carriers in said channel are confined to a group of one or more of the lowest lying such discrete energy levels, so that no more than two charge carriers may occupy each level of said group of lowest lying discrete energy levels;

maintaining said substrate at a temperature such that charge carriers in said elongated channel are confined to said group of lowest lying discrete energy levels;

supplying charge carriers to said channel through an input terminal at one end of said elongated channel, an output terminal being provided at the other end of said elongated channel connected to said output element; and applying periodic varying voltages to control conductive elements spaced along the length of said elongated channel, said control conductive elements being connected in sets so that elements of any set are spaced from other elements of the same set by one element of each other set, a pair of neighboring elements from said two sets forming a cell, each set of elements being connected to a periodically varying voltage, said periodic varying voltages applied to each set being out of phase with the periodic varying voltages of the other sets so that charge carriers introduced into said channel at said input end are transferred sequentially along said channel under the influence of said periodically varying voltages to said output end, with the current supplied to said output end equalling one or two electronic charges for each level of said group per cell for each complete cycle of said periodically varying voltages.

* * * * *